US010197912B2

(12) United States Patent
Yang et al.

(10) Patent No.: US 10,197,912 B2
(45) Date of Patent: Feb. 5, 2019

(54) METHOD FOR MANUFACTURING COLOR PHOTORESIST PATTERN IN COLOR FILTER

(71) Applicants: BOE TECHNOLOGY GROUP CO., LTD., Beijing (CN); BEIJING BOE DISPLAY TECHNOLOGY CO., LTD., Beijing (CN)

(72) Inventors: Tonghua Yang, Beijing (CN); Hongjiang Wu, Beijing (CN); Min Li, Beijing (CN); Jikai Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/358,709

(22) Filed: Nov. 22, 2016

(65) Prior Publication Data
US 2017/0097569 A1 Apr. 6, 2017

Related U.S. Application Data

(63) Continuation-in-part of application No. 14/351,740, filed as application No. PCT/CN2013/088944 on Dec. 10, 2013.

(30) Foreign Application Priority Data

May 24, 2013 (CN) .......................... 2013 1 0198744

(51) Int. Cl.
*G03F 7/00* (2006.01)
*G03F 7/32* (2006.01)
*G02F 1/1335* (2006.01)

(52) U.S. Cl.
CPC ....... *G03F 7/0007* (2013.01); *G02F 1/133516* (2013.01); *G03F 7/32* (2013.01)

(58) Field of Classification Search
CPC .................................................... G03F 7/0007
See application file for complete search history.

(56) References Cited

U.S. PATENT DOCUMENTS

| H1299 H | * | 4/1994 | Charles | ................. | G03F 7/0003 |
| | | | | | 430/331 |
| 5,800,952 A | * | 9/1998 | Urano | ..................... | G03F 7/027 |
| | | | | | 430/20 |

(Continued)

FOREIGN PATENT DOCUMENTS

| CN | 101075089 A | 11/2007 |
| CN | 101101444 A | 1/2008 |

(Continued)

OTHER PUBLICATIONS

Machine translation CN 101290480. Oct. 22, 2008. (Year: 2008).*

(Continued)

*Primary Examiner* — Cynthia H Kelly
*Assistant Examiner* — Alyssa L Cepluch
(74) *Attorney, Agent, or Firm* — Ladas & Parry LLP

(57) ABSTRACT

A method for manufacturing a color photoresist pattern in a color filter is provided. The method includes applying a layer of negative color resist onto a substrate; exposing the layer of negative color resist through a mask; and developing the exposed layer of negative color resist with a developer composition which comprises 0.01 to 5.0 parts by weight of inorganic or organic acids, 0.01 to 5.0 parts by weight of surfactant, 0.1 to 10.0 parts by weight of water-soluble organic solvent, 85 to 99 parts by weight of water, and 0 to 2 parts by weight of additives, based on 100 parts by weight of the developer composition.

13 Claims, 1 Drawing Sheet

(56) References Cited

U.S. PATENT DOCUMENTS

| | | | |
|---|---|---|---|
| 5,888,679 A * | 3/1999 | Suzuki | G02F 1/133516 349/106 |
| 2002/0119404 A1 | 8/2002 | Fiebag et al. | |
| 2007/0128550 A1 | 6/2007 | Inno | |
| 2009/0075208 A1 | 3/2009 | Sonokawa et al. | |
| 2012/0058436 A1 | 3/2012 | Tsubaki et al. | |
| 2014/0020585 A1 | 1/2014 | Sonokawa | |
| 2014/0147789 A1 | 5/2014 | Nakayama et al. | |
| 2014/0202349 A1 | 7/2014 | Sonokawa et al. | |

FOREIGN PATENT DOCUMENTS

| | | | |
|---|---|---|---|
| CN | 101290480 A | | 10/2008 |
| CN | 101526761 A | | 9/2009 |
| CN | 103293881 A | | 9/2013 |
| JP | 5488328 A | | 7/1979 |
| JP | 05323607 A | * | 12/1993 |
| WO | 2012/133382 A1 | | 10/2012 |
| WO | 2013027590 A1 | | 2/2013 |
| WO | 2013047229 A1 | | 4/2013 |

OTHER PUBLICATIONS

Machine translation JP 05-323607. Dec. 7, 1993. (Year: 1993).*
Charles. US H1299. Apr. 5, 1994. (Year: 1994).*
First Chinese Office Action dated Sep. 25, 2014; Appln. No. 201310198744.4.
International Search Report dated Jan. 29, 2014; PCT/CN2013/088944.
International Preliminary Report on Patentability dated Nov. 24, 2015; PCT/CN2013/088944.
Chinese Patent Certificate dated Nov. 25, 2015; ZL 2013 1 0198744.4.
USPTO NFOA dated Jul. 16, 2015 in connection with U.S. Appl. No. 14/351,740.
USPTO NFOA dated Feb. 29, 2016 in connection with U.S. Appl. No. 14/351,740.
USPTO AA dated Nov. 14, 2016 in connection with U.S. Appl. No. 14/351,740.

* cited by examiner

METHOD FOR MANUFACTURING COLOR PHOTORESIST PATTERN IN COLOR FILTER

RELATED APPLICATION

This application is a continuation-in-part of U.S. patent application Ser. No. 14/351,740 by Tonghua Yang et al. under the title "Developer Composition."

TECHNICAL FIELD

Embodiments of the present disclosure relate to a method for manufacturing a photoresist pattern in a color filter by using a new developer composition.

BACKGROUND

Color filters are optical filter exhibiting colors. They can precisely selectively transmit light within a narrow range of wavelengths, and reflect light within other undesired wavelengths. Color filters are generally positioned at the front of a light source, so that the eyes of customers can receive saturated light of a certain color. Currently, there are red, green, blue color filters, etc.

The developer composition used in color filters are commonly basic developer compositions, including inorganic basic developer composition, such as, carbonates or potassium hydroxides; and organic basic developer composition, such as, tetramethylammonium hydroxides. Basic developer compositions are widely used due to its good developing properties for photoresists. Over the development of liquid display, high brilliance and high transmission become more important. For satisfying these performance indite, the pigment particles in the photoresists should have to become finer. However, it is well known that the smaller the pigment particles, the more complicated the process for dispersing the particles, and the incorporation of basic hyperdispersants can improve effectively the dispersing stability of particles, e.g., as described in CN101403858. It will result in that the produced photoresists show deteriorated resolution in the basic developer composition and are unlikely to form the designed patterns. Moreover, inorganic basic developer composition may remain in the photoresist layer due to the presence of metal ions including $Na^+$, $K^+$, etc., which is likely to contaminating the liquid crystal and causing the occurrence of defects, such as, image retention.

SUMMARY

To address the aforesaid problems, an embodiment of the present disclosure provides a developer composition comprising: based on 100 parts by weight of the developer composition,

| | |
|---|---|
| inorganic or organic acid | 0.01 to 5.0 parts by weight, |
| surfactant | 0.01 to 5.0 parts by weight, |
| water-soluble organic solvent | 0.1 to 10.0 parts by weight, |
| water | 85 to 99 parts by weight, and |
| additives | 0 to 2 parts by weight. |

In one aspect, the inorganic acid may be is one or more selected from the group consisting of hydrochloric acid, sulfuric acid, nitric acid, phosphoric acid, carbonic acid and boric acid; and the organic acid may be one or more selected from the group consisting of formic acid, acetic acid, propionic acid, benzoic acid, oxalic acid, malonic acid, succinic acid, adipic acid, itaconic acid, citraconic acid, and fumaric acid.

In another aspect, the surfactant may be cationic surfactant, anionic surfactant or nonionic surfactant. The cationic surfactant may be primary amine salt, secondary amine salt, tertiary amine salt, or quaternary ammonium salt. The anionic surfactant may be carboxylates, sulfonates, sulfates or phosphates. The nonionic surfactant may be polyoxyethylenes, polyols, polyethers, or alkanolamides.

In yet another aspect, the water-soluble organic solvent may be one or more selected from the group consisting of methanol, ethanol, propanol, ethylene glycol, propylene glycol, isopropanol, N,N-dimethylformamide, N,N-dimethylacetamide, acetone, N-methylpyrrolidone and N-ethylpyrrolidone.

In still another aspect, the water is deionized water.

In still yet another aspect, the additives comprise at least one of defoamer and stabilizer.

Another embodiment of the present disclosure provides a method for manufacturing a color photoresist pattern in a color filter, wherein said method may comprise:

applying a layer of negative color photoresist onto a substrate which has been provided with a black matrix;
exposing the layer of negative color photoresist through a mask; and
developing the exposed layer of negative color photoresist with the above developer composition.

In one aspect, the method may further comprise:
before the applying a layer of negative color photoresist onto the substrate, cleaning and drying the substrate which has been provided with a black matrix.

In another aspect, the method may further comprise:
drying in vacuum and prebaking the photoresist before the exposing the layer of negative color photoresist.

In another aspect, the method may further comprise:
curing the developed photoresist by baking after the developing the exposed layer of negative color photoresist.

Figure 1:
FIG. 1 is a schematic showing distribution of color photoresists in a color filter according to an embodiment of the present disclosure.

wherein the reference signs are:

1-Substrate, 2-Black Matrix, 3-Red Photoresist, 4-Blue Photoresist, 5-Green Photoresist, 6-Mask.

DETAILED DESCRIPTION OF DISCLOSURE

The terms "comprising", "including", "having" and their derivatives are not intended to exclude the presence of any additional component, step or procedure, whether or not the same is specifically described. The contents of any patent, patent application, or publication referenced herein are hereby incorporated by reference in their entirety.

For further clarifying the objects, technical solutions, and advantages of the present disclosure, the following examples are provided to illustrate the present disclosure in details.

The developer composition according to an embodiment of the present disclosure comprises based on 100 parts by weight of the developer composition,

| | |
|---|---|
| inorganic or organic acid | 0.01 to 5.0 parts by weight, |
| surfactant | 0.01 to 5.0 parts by weight, |
| water-soluble organic solvent | 0.1 to 10.0 parts by weight, |
| water | 85 to 99 parts by weight, and |
| additives | 0 to 2 parts by weight. |

In one aspect of the present disclosure, the inorganic acid may be one or more selected from the group consisting of hydrochloric acid, sulfuric acid, nitric acid, phosphoric acid, carbonic acid and boric acid; and the organic acid may be one or more selected from the group consisting of formic acid, acetic acid, propionic acid, benzoic acid, oxalic acid, malonic acid, succinic acid, adipic acid, itaconic acid, citraconic acid, and fumaric acid.

The inorganic or organic acids impart an acidic property to the developer composition according to the embodiment of the present disclosure. If the amount of the inorganic or organic acid is less than 0.01 part by weight, the developer composition exhibits a relatively high pH value and insufficient developing ability; and if the amount of inorganic or organic acid is greater than 5.0 parts by weight, the developer composition exhibits a relatively high pH value and may corrade the film surface.

In another aspect, the surfactant may be primary amine salts, secondary amine salts, tertiary amine salts, or quaternary ammonium salts (e.g., lauryldimethylbenzylammonium chloride, stearyldimethylbenzylammonium chloride, cetyltrimethylammonium chloride(bromide))-based cationic surfactant; or the surfactant may be carboxylates, sulfonates, sulfates or phosphates anionic surfactant; or the surfactant may be polyoxyethylenes, polyols, polyethers, or alkanolamides-based nonionic surfactant; or the surfactant may be any combination of the aforesaid surfactants.

The surfactant imparts good wettability and solubility to the developer composition according to the embodiment of the present disclosure, and can improve effectively the developing linearity. If the amount of the surfactant is less than 0.01 part by weight, the developer composition exhibits insufficient wettability and deteriorated developing linearity; and if the amount of surfactant is greater than 5 parts by weight, the surfactant is unlikely to dissolve in the developer composition and tends to separate out, so as to cause the waste of cost.

In another aspect, the water-soluble organic solvent may be one or more selected from the group consisting of methanol, ethanol, propanol, ethylene glycol, propylene glycol, isopropanol, N,N-dimethylformamide, N,N-dimethylacetamide, acetone, N-methylpyrrolidone and N-ethylpyrrolidone.

The water-soluble organic solvent imparts good wettability and solubility to the developer composition according to the embodiment of the present disclosure, and can enhance effectively the solubility of the surfactant in the developer composition. If the amount of the water-soluble organic solvent is less than 0.1 parts by weight, the surfactant is unlikely to dissolving in the developer composition and exhibits insufficient wetting ability; and if the amount of water-soluble organic solvent is greater than 10.0 parts by weight, the cost will be increased and the composition is not environmentally friendly.

In another aspect, the water is deionized water.

In yet another aspect, the additives comprise at least one of defoamer and stabilizer.

The object of adding additives is to impart good stability to the developer composition according to the embodiment of the present disclosure.

The developer composition according to the embodiment of the present disclosure is an acidic developer composition, and can address the problem that the pigment particles in the photoresists are unlikely to developing in a basic developer composition caused by the incorporation of hyperdispersants during fining of the particles, thereby satisfying the requirements of good resolution and refined patterns. Moreover, the developer composition according to the embodiment of the present disclosure is an acidic, metal ion-free developer composition, thereby avoiding the problem that the liquid crystal is contaminated by metal ions (such as, $Na^+$, $K^+$, etc.) residua in a basic developer composition, and preventing effectively from image retention in a liquid crystal panel.

A color photoresist pattern in a color filter as shown in FIG. 1 may be prepared by various methods employing the above developer compostion. For example, a method for preparing a color photoresist pattern in a color filter may comprise the following steps:

1. Cleansing

Figure 2:
FIG. 2 is a schematic showing a substrate provided with a black matrix.

In this step, a substrate (such as a glass substrate) which has been provided with a black matrix (see FIG. 2) is cleaned (for example by a thorough solvent rinse) and dried.

2. Applying Photoresist

Figure 3:
FIG. 3 is a schematic showing applying photoresists onto a substrate provided with a black matrix.

In this step, a layer of negative photoresist, for example a red negative photoresist, is applied onto the substrate (see FIG. 3) by means of a coating machine for example a spin-coating system. After being dried, the layer has a thickness of around 0.5 μm to 3 μm depending on the product requirement.

3. Drying in Vacuum and Pre-Baking

In this step, the photoresist layer is dried in vacuum and pre-baked, for example pre-baked at a temperature of 60-100° C. for about 60-300 seconds.

4. Exposure

Figure 4:
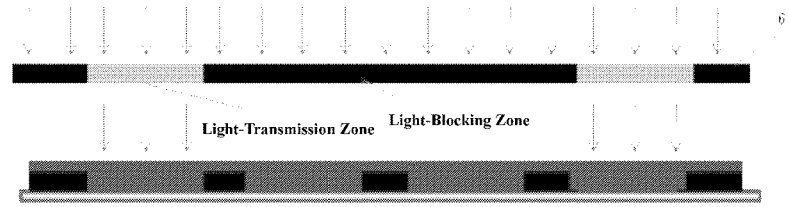
FIG. 4 is a schematic showing exposing photoresists through a mask.

In this step, the photoresist layer is irradiated by rays such as ultraviolet light emitted from an exposure machine through a mask (see FIG. 4), so as to subject the place in which a pattern to be retained sufficient irradiation and subject other place to no irradiation. For example, the exposure dose may be about 30-100 mJ.

5. Development

In this step, the photoresist layer is developed with the above developer composition. Because the photoresist layer is a negative exposure material, the initiator in the photoresist is decomposed upon for example UV irradiation to form free radicals, which enable the cross linker monomer and the binder resin to open double bond. Cross-linking reaction occurs between the components to form a film having a stable structure and insolubility in the developer. As for the unexposed part, because the binder resin contains a basic group and is not protected by a crosslinked network, it reacts with the acidic developer composition and gets dissolved, thereby forming a specific pattern. For example, the development duration may be about 50-120 seconds.

6. Curing

In this step, the photoresist layer is cured by a post-exposure baking for example, at 200-250° C. The residual moisture in the photoresist layer is evaporated and the photoresist layer is further crosslinked and cured to improve adhesion of the photoresist layer to the substrate.

Figure 5:
FIG. 5 is a schematic showing the photoresists obtained after development and curing.

FIG. 5 shows the photoresists obtained after the above development and curing.

FIG. 1 shows a color filter with a pattern of red photoresists, blue photoresists and green photoresists. Such a pattern may be obtained by repeating the above processes.

Hereinafter the developer composition according to the embodiments of the present disclosure and its properties for developing color photoresists are described in details, with reference to the examples.

Example 1

0.3 parts by weight of hydrochloric acid, 0.5 parts by weight of sodium lauryl sulfate, 5 parts by weight of ethanol, and 0.01 part by weight of defoamer were added into 94.19 parts by weight of deionized water, stirred homogenously to produce a developer composition 1.

Example 2

0.3 parts by weight of hydrochloric acid, 1.0 parts by weight of lauryldimethylbenzylammonium chloride, 6 parts by weight of N-methylpyrrolidone, and 0.01 part by weight of defoamer were added into 92.69 parts by weight of deionized water, stirred homogenously to produce developer composition 2.

Example 3

0.3 parts by weight of dilute sulfuric acid, 0.5 parts by weight of sodium lauryl benzenesulfonate, 0.5 parts by weight of span20, 4 parts by weight of N,N-dimethylformamide, and 0.01 part by weight of defoamer were added into 94.69 parts by weight of deionized water, stirred homogenously to produce developer composition 3.

Example 4

0.4 parts by weight of dilute sulfuric acid, 1.5 parts by weight of Tween 80, 5 parts by weight of N,N-dimethylformamide, and 0.01 part by weight of defoamer were added into 93.09 parts by weight of deionized water, stirred homogenously to produce developer composition 4.

Example 5

0.01 part by weight of hydrochloric acid, 0.5 parts by weight of sodium lauryl sulfate, and 10 parts by weight of ethanol were added into 89.49 parts by weight of deionized water, stirred homogenously to produce developer composition 5.

Example 6

5 parts by weight of hydrochloric acid, 0.01 part by weight of sodium lauryl sulfate, and 5 parts by weight of ethanol were added into 89.99 parts by weight of deionized water, stirred homogenously to produce developer composition 6.

Example 7

0.3 parts by weight of hydrochloric acid, 5 parts by weight of sodium lauryl benzenesulfonate, and 0.1 parts by weight of ethanol were added into 94.6 parts by weight of deionized water, stirred homogenously to produce developer composition 7 (slightly cloudy).

Example 8

0.4 parts by weight of malonic acid, 1 part by weight of Tween 80, 1 part by weight of Span 20, 2 parts by weight of isopropanol, and 0.02 parts by weight of defoamer were added into 95.58 parts by weight of deionized water, stirred homogenously to produce developer composition 8.

Example 9

1 part by weight of succinic acid, 1 part by weight of sodium lauryl sulfate, 0.5 parts by weight of Tween 80, 4 parts by weight isopropanol, and 0.03 parts by weight of defoamer were added into 93.47 parts by weight of deionized water, stirred homogenously to produce developer composition 9.

Hereinafter the advantages of the developer composition according to the embodiments of the present disclosure are described with reference to experimental comparison, wherein developer compositions comprising the following components are used as Comparative Examples.

Comparative Example 1

0.4 parts by weight of KOH and 0.5 parts by weight of sodium lauryl sulfate were added into 99.1 parts by weight of deionized water, stirred homogenously to produce comparative developer composition 1.

Comparative Example 2

0.3 parts by weight of sodium carbonate, 0.2 parts by weight of sodium bicarbonate, and 0.5 parts by weight of octylphenol polyoxyethylene ether were added into 99 parts by weight of deionized water, stirred homogenously to produce comparative developer composition 2.

Each of the aforesaid developer compositions was subject to developing color photoresists for test.

Various performance indice of Examples 1 to 9, Comparative Example 1, and Comparative Example 2 are listed in Table 1 as below.

TABLE 1

Various performance indice of Examples 1 to 9, Comparative Example 1, and Comparative Example 2

| | Developing Property | Wettability | Amount of Residua | Defoaming Property | Dispersing Stability |
|---|---|---|---|---|---|
| developer composition 1 | ⊚ | ⊚ | ⊚ | ⊚ | ⊚ |
| developer composition 2 | ○ | ⊚ | ⊚ | ⊚ | ⊚ |
| developer composition 3 | ⊚ | ⊚ | ⊚ | ⊚ | ⊚ |
| developer composition 4 | ⊚ | ⊚ | ⊚ | ⊚ | ⊚ |

TABLE 1-continued

Various performance indice of Examples 1 to 9, Comparative Example 1, and Comparative Example 2

|  | Developing Property | Wettability | Amount of Residua | Defoaming Property | Dispersing Stability |
|---|---|---|---|---|---|
| developer composition 5 | ○ | ⊚ | ○ | ○ | ○ |
| developer composition 6 | ○ | ⊚ | ○ | ○ | ⊚ |
| developer composition 7 | ⊚ | ⊚ | ⊚ | Δ | ⊚ |
| developer composition 8 | ⊚ | ⊚ | ⊚ | ⊚ | ⊚ |
| developer composition 9 | ⊚ | ⊚ | ⊚ | ⊚ | ⊚ |
| comparative developer composition 1 | Δ | ⊚ | Δ | ○ | ○ |
| comparative developer composition 2 | Δ | ⊚ | Δ | ○ | ○ |

Among others, the testing standards of each index and the meaning of each label are provided as follows:

1) Developing properties: Observing the integrality of various pixels and the regularity of pattern edges under a 200× microscope.
   ⊚: Good
   ○: Moderate
   Δ: Poor
2) Wettability: Observed the spreading of 50 mg of the developer composition onto the surface of photoresist film.
   ⊚: Good
   ○: Moderate
   Δ: Poor
3) Amount of Residua: Observe under 1000× scanning electron microscope if there is residua in the non-pixel area of glass substrate.
   ⊚: No residua
   ○: A few residua
   Δ: Many residua
4) Defoaming property: 30 ml of developer composition was charged into a 100 ml cuvette, and shaken up and down. Then, measure the height of foams.
   ⊚: Less than 0.5 cm
   ○: Between 0.5 cm and 1.0 cm
   Δ: Greater than 1.0 cm
5) Dispersing stability: 1 g color photoresists was added into 500 ml developer composition, mixed to homogenous, and kept stand for 1 hr. The mixture was filtered with a 5-micron filter paper, and then the filter paper was dried at 100° C. to constant weight. Evaluation was made in accordance with the weight change of the filter paper.
   ⊚: Weight change of filter paper of less than 0.01 g
   ○: Weight change of filter paper between 0.01 and 0.03 g
   Δ: Weight change of filter paper of greater than 0.03 g The results as shown in Table 1 indicate that the developer composition according to the embodiments of the present disclosure appears good in terms of developing property, wettability, amount of residua, defoaming property, and dispersing stability, and satisfy the requirements of a developer composition for producing high-fining and high-resolution color filters.

The aforesaid description is illustrative, other than limitative to the present disclosure. Person of ordinary skill in the art understand that many modifications, changes, or equivalences can available without departing the spirit and scope of the accompanying claims, and all of these modifications, changes, and equivalences fall within the scope of the present disclosure.

We claim:

1. A method for manufacturing a color photoresist pattern in a color filter, wherein said method comprising:
   applying a layer of negative color photoresist onto a substrate which has been provided with a black matrix;
   exposing the layer of negative color photoresist through a mask; and
   developing the exposed layer of negative color photoresist with an acidic developer composition, which comprises: based on 100 parts by weight of the acidic developer composition,

| | |
|---|---|
| inorganic acid | 0.01 to 5.0 parts by weight, |
| surfactant | 0.01 to 5.0 parts by weight, |
| water-soluble organic solvent | 0.1 to 10.0 parts by weight, |
| water | 85 to 99 parts by weight, and |
| additives | 0 to 2 parts by weight. |

2. The method of claim 1, wherein the inorganic acid is one or more selected from the group consisting of hydrochloric acid, sulfuric add, nitric acid, phosphoric acid, carbonic acid and boric acid.

3. The method of claim 1, wherein the surfactant comprises at least one selected from cationic surfactant, anionic surfactant and nonionic surfactant.

4. The method of claim 3, wherein the surfactant comprises a cationic surfactant which is one or more selected from the group consisting of primary amine salts, secondary amine salts, tertiary amine salts, and quaternary ammonium salts.

5. The method of claim 3, wherein the surfactant comprises an anionic surfactant which is one or more selected from the group consisting of carboxylates, sulfonates, sulfate and phosphates.

6. The method of claim 3, wherein the surfactant comprises a nonionic surfactant which is one or more selected from the group consisting of polyols, polyethers, and alkanol amides nonionic surfactants.

7. The method of claim 6, wherein the polyethers are polyoxyethylenes.

8. The method of claim 1, wherein the water-soluble organic solvent is one or more selected from the group consisting of: methanol, ethanol, propanol, ethylene glycol, propylene glycol, isopropanol, N,N-dimethylformamide, N,N-dimethylacetaminde, acetone, N-methylpyrrolidone, and N-ethylpyrrolidone.

9. The method of claim 1, wherein the water is deionized water.

10. The method of claim 1, wherein the additives comprise at least one of defoamer and stabilizer.

11. The method of claim 1, further comprising:
before the applying a layer of negative color photoresist onto the substrate, cleaning and drying the substrate which has been provided with a black matrix.
12. The method of claim 1, further comprising:
drying in vacuum and prebaking the layer of negative color photoresist before the exposing the layer of negative color photoresist.
13. The method of claim 1, further comprising:
curing the developed photoresist by baking after the developing the exposed layer of negative color photoresist.

\* \* \* \* \*